(12) United States Patent
Chen et al.

(10) Patent No.: US 10,340,215 B2
(45) Date of Patent: Jul. 2, 2019

(54) CHIP ON FILM AND DISPLAY DEVICE

(71) Applicant: BOE TECHNOLOGY GROUP CO., LTD., Beijing (CN)

(72) Inventors: Liqiang Chen, Beijing (CN); Weifeng Zhou, Beijing (CN); Wenyue Fu, Beijing (CN); Huiji Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/538,340

(22) PCT Filed: May 16, 2016

(86) PCT No.: PCT/CN2016/082220
§ 371 (c)(1),
(2) Date: Jun. 21, 2017

(87) PCT Pub. No.: WO2017/133127
PCT Pub. Date: Aug. 10, 2017

(65) Prior Publication Data
US 2018/0108604 A1    Apr. 19, 2018

(30) Foreign Application Priority Data
Feb. 4, 2016 (CN) .......................... 2016 1 0079781

(51) Int. Cl.
*H01L 23/498* (2006.01)
*G09F 9/30* (2006.01)
(Continued)

(52) U.S. Cl.
CPC .......... *H01L 23/49838* (2013.01); *G09F 9/30* (2013.01); *H01L 23/4985* (2013.01);
(Continued)

(58) Field of Classification Search
CPC .................... H01L 23/49838; H01L 23/49827
See application file for complete search history.

(56) References Cited

U.S. PATENT DOCUMENTS 6,271,478 B1 * 8/2001 Horiuchi ............. H01L 23/5384
174/255
6,664,483 B2 * 12/2003 Chong .............. H01L 23/49838
174/261
(Continued)

FOREIGN PATENT DOCUMENTS

CN 1627513 A 6/2005
CN 1638107 A 7/2005
(Continued)

OTHER PUBLICATIONS

Chinese Office Action in Chinese Application No. 201610079781.7, dated Nov. 3, 2017 with English translation.
(Continued)

*Primary Examiner* — Dung A. Le
(74) *Attorney, Agent, or Firm* — Collard & Roe, P.C.

(57) ABSTRACT

Disclosed are a chip on film and a display device. the chip on film includes a plurality of output pads independent from each other extending in the first direction on a side of a base material; correspondingly, a flexible display panel in the display device includes a plurality of input pads in one-to-one correspondance with output pads extending in the first direction in the bonding region. The chip on film can improve the bonding yield and stability of the display device.

16 Claims, 3 Drawing Sheets

(51) Int. Cl.
*H05K 1/18* (2006.01)
*H05K 1/11* (2006.01)

(52) U.S. Cl.
CPC ....... *H01L 23/49827* (2013.01); *H05K 1/189* (2013.01); *H01L 2224/32225* (2013.01); *H05K 1/118* (2013.01); *H05K 2201/09227* (2013.01); *H05K 2201/10128* (2013.01)

(56) References Cited

U.S. PATENT DOCUMENTS

| | | | |
|---|---|---|---|
| 7,154,187 B2 | 12/2006 | Yuzawa | |
| 7,279,794 B2 | 10/2007 | Yuzawa | |
| 2006/0060889 A1* | 3/2006 | Uchida | H01L 27/0207 257/206 |
| 2009/0153791 A1 | 6/2009 | Chang et al. | |
| 2016/0218053 A1* | 7/2016 | Cho | G02F 1/13452 |
| 2017/0125314 A1* | 5/2017 | Lim | H01L 22/32 |
| 2017/0148419 A1 | 5/2017 | Zhang et al. | |

FOREIGN PATENT DOCUMENTS

| | | |
|---|---|---|
| CN | 101252105 A | 8/2008 |
| CN | 104851369 A | 8/2015 |
| CN | 105513498 A | 4/2016 |
| CN | 205541693 U | 8/2016 |
| JP | 2008-205142 A | 9/2008 |
| JP | 2008-288273 A | 11/2008 |
| JP | 2009-194058 A | 8/2009 |
| JP | 2010-010375 A | 1/2010 |
| KR | 2002-0075556 A | 10/2002 |

OTHER PUBLICATIONS

International Search Report of PCT/CN2016/082220 in Chinese, dated Nov. 2, 2016 with English translation.
Notice of Transmittal of the International Search Report of PCT/CN2016/082220 in Chinese, dated Nov. 2, 2016.
Written Opinion of the International Searching Authority of PCT/CN2016/082220 in Chinese, dated Nov. 2, 2016 with English translation.

* cited by examiner

CHIP ON FILM AND DISPLAY DEVICE

CROSS REFERENCE TO RELATED APPLICATIONS

This application is the National Stage of PCT/CN2016/082220 filed on May 16, 2016, which claims priority under 35 U.S.C. § 119 of Chinese Application No. 201610079781.7 filed on Feb. 4, 2016, the disclosure of which is incorporated by reference.

TECHNICAL FIELD

Embodiments of the present disclosure relate to a chip on film and a display device.

BACKGROUND

Flexible display technology is a research hot point in display technology field in recent years and will be widely applied to civil field and military field due to its advantages such as being thinner, more shock resistant and more portable. Flexible display may be defined as manufacturing the substrate of the display panel with a thin base substrate which can be bent to only several centimeters or smaller radius of curvature but will not damage the display function of the display panel.

SUMMARY

At least one embodiment of the present disclosure provides a chip on film, which comprises: a base material, and a plurality of mutually independent output pads extending in a first direction and disposed on a side of the base material.

For example, in a chip on film provided by an embodiment of the present disclosure, the chip on film further comprises: a chip, and a plurality of leads in one-to-one correspondence with the output pads extending in a second direction, wherein the leads are configured to connect corresponding output pads to the chip.

For example, in a chip on film provided by an embodiment of the present disclosure, the second direction is perpendicular to the first direction.

For example, in a chip on film provided by an embodiment of the present disclosure, the output pads constitute at least one set of staggered structures which are parallel to each other in a direction perpendicular to the first direction and staggered in sequence in the first direction by a certain distance.

For example, in a chip on film provided by an embodiment of the present disclosure, the output pads constitute at least one set of interdigitated electrode structures arranged in a direction perpendicular to the first direction.

For example, in a chip on film provided by an embodiment of the present disclosure, the at least one set of the interdigitated electrode structures is arranged in the first direction.

For example, in a chip on film provided by an embodiment of the present disclosure, the leads comprise a plurality sets of sub-leads disposed on different layers.

For example, in a chip on film provided by an embodiment of the present disclosure, the sub-leads located on different layers overlap at least partially in a direction perpendicular to the base material.

For example, in a chip on film provided by an embodiment of the present disclosure, the chip and the output pads are located on two sides of the base material, respectively, the leads comprise: first leads disposed on the base material on a same side as the output pads, and second leads disposed on the base material on a same side as the chip, wherein, one ends of the first leads are connected with a part of output pads that constitute the interdigitated electrode structures, and another ends of the first leads are connected with the chip through first vias penetrating the base material, one ends of the second leads are connected with another part of the output pads that constitute the interdigitated electrode structures through second vias penetrating the base material, and another ends of the second leads is connected with the chip.

For example, in a chip on film provided by an embodiment of the present disclosure, the output pads connected with the first leads and the output pads connected with the second leads are distributed among the interdigitated electrode structures alternatively.

For example, in a chip on film provided by an embodiment of the present disclosure, the second vias are located in a region where the interdigitated electrode structures are located.

For example, in a chip on film provided by an embodiment of the present disclosure, the second vias are located outside the region where the interdigitated electrode structures are located, and the leads further comprise: third leads disposed on a same layer as the first leads and in one-to-one correspondence with the second leads, one end of each of the third leads is connected with one end of a corresponding one of the second leads through the second via, and another end of each of the third leads is connected with another partial output pads that constitute the interdigitated electrode structures.

For example, in a chip on film provided by an embodiment of the present disclosure, the output pads are parallel to each other in a direction perpendicular to the first direction.

At least one embodiment of the present disclosure provides a display device, which comprises: a flexible display panel, and any one of the abovementioned chip on film bonded on a bonding region of the flexible display panel, the flexible display panel has a plurality of input pads in one-to-one correspondence with the output pads of the chip on film extending in the first direction in the bonding region, and the output pads and the output pads in one-to-one correspondence with each other are electrically connected by pressure welding.

For example, in a display device provided by an embodiment of the present disclosure, the input pads have a length in the first direction smaller than a length of the output pads in one-to-one correspondence with the input pads in the first direction.

For example, in a display device provided by an embodiment of the present disclosure, the input pads have a width in a direction perpendicular to the first direction greater than a width of the output pads in one-to-one correspondence with the input pads in a direction perpendicular to the first direction

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention, but not limitative to the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the disclosure. Based on the described embodiments herein, one person skilled in the art can obtain other embodiment(s), without any inventive work, which should be within the scope of the present disclosure.

Shapes and sizes of parts in accompanying drawings do not reflect the real proportion of the display device and only illustrate contents of the present disclosure.

While manufacturing a flexible display device, generally, a flexible substrate is first mounted onto a glass substrate, and then manufacturing process for the flexible display panel is performed. Such process is compatible with the manufacturing equipment for the existing display panel. After the flexible display panel is manufactured, the flexible substrate is separated from the glass substrate. Then a back film is attached on the back side of the flexible substrate to planarize the flexible substrate, and finally processes such as chip on film (COF) bonding are performed.

In research, the inventor(s) of the present application notices that: the flexible display panel is generally very thin after being separated from the glass substrate which tends to make the flexible display panel to experience minute size variation due to force action in the process of attaching the back film. During the subsequent bonding of COF, since the output pads on COF are dense and are generally aligned in elevation direction and hence sensitive to the size variation, size variation of the flexible display panel will cause problems such as misalignment between output pads on the flexible display panel and the output pads on the COF upon bonding, and not conducted circuit, therefore influencing the yield.

First Embodiment

Figure 1:
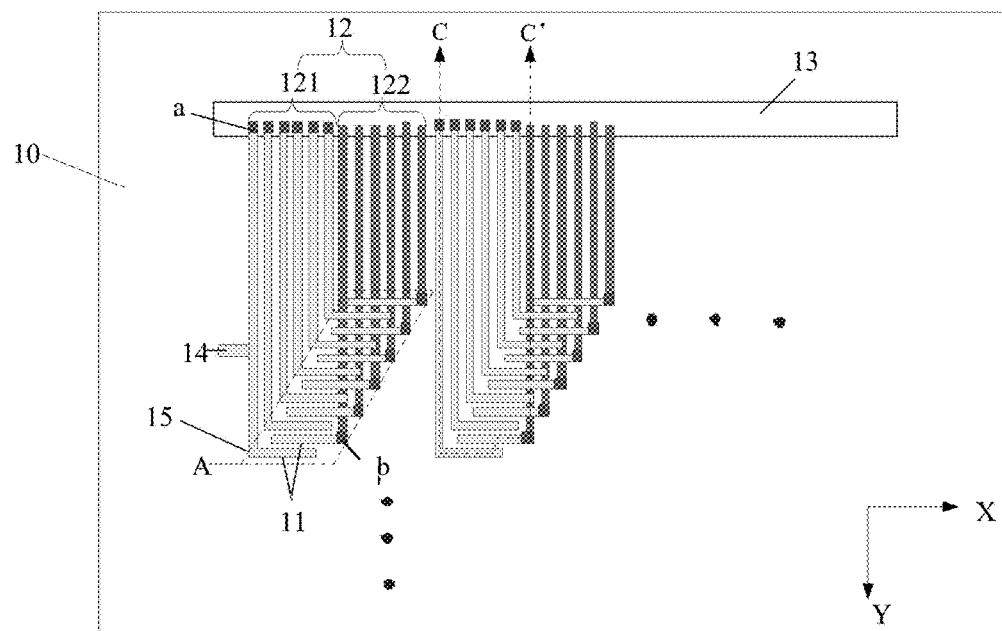
FIG. 1 is a structure diagram of a chip on film provided in an embodiment of the present disclosure.

The present embodiment provides a chip on film. As shown in FIG. 1, the chip on film comprises: a base material 10, and a plurality of output pads 11 independent from each other extending in the first direction on a side of the base material 10, that is, the output pad 11 has a size in the first direction greater than that of the output pad 11 in other direction. It is to be noted that the above-mentioned first direction is parallel to the direction in which to bend the base material. The above-mentioned first direction is the x direction shown in FIG. 1. In general, the above-mentioned first direction may be the horizontal direction, for example, parallel to the long side direction of a rectangular display device.

With the chip on film provided in the present embodiment, by changing output pads 11 from extending generally in elevation direction along the first diretion, the output pad 11 occupies large span in the first direction. When the size of the flexible display panel varies in the first direction, it is possible to guarantee that the output pads 11 of the chip on film and the input pads of the flexible display panel align correctly, thereby improving the bonding yield and reliability of the display device. Furthermore, although the output pad 11 occupies reduced span in the elevation direction after extending in the first direction, since the substrate size in elevation direction of the flexible display panel will not change, it will not influence the alignement in elevation direction. It is to be noted that the above-mentioned elevation direction is the y direction shown in FIG. 1, for example, parallel to the direction of short side of the rectangular display device.

For example, in the chip on film provided in an example of the present embodiment, as shown in FIG. 1, output pads 11 are parallel to each other in the direction perpendicular to the first direction. Therefore, when the chip on film provided in the present embodiment is bent, output pads will not contact each other due to deformation. In this case, the spacebetween output pads 11 may be set to be small, thereby more output pads may be formed on the base material.

For example, as shown in FIG. 1, the chip on film provided in an example of the present embodiment further includes: a chip 13, and a plurality of leads 12 in one-to-one correspondence with the output pads 11 extending in the second direction, each of the leads 12 is configured to connect the corresponding output pad 11 to the chip 13. And as shown in FIG. 1, an alignment tag 14 disposed at the position of the lead 12 at the most edge is further included for the alignment upon bonding the chip on film and the display panel.

For example, in the chip on film provided in an example of the present embodiment, as shown in FIG. 1, the second direction is perpendicular to the first direction. As shown in FIG. 1, the second direction may be the elevation direction. Of course, the present embodiment includes but not limited thereto, and the second direction may not be perpendicular to the first direction as long as that each of the leads connect the corresponding output pad to the chip.

For example, in the chip on film provided in an example of the present embodiment, output pads 11 may constitute at least one set of stagger structures which are parallel to each other in the direction perpendicular to the first direction and staggered by a certain distance in sequence in the first direction. Thereby, the distance by which they are staggered in sequence in the first direction can guarantee that leads can connect corresponding output pads 11 to the chip 13 by being connected with one end of output pads 11.

For example, in the chip on film provided in an example of the present embodiment, in order to satisfy the demand of more signal channels for high resolution products, there are a large number of output pads 11 on the chip on film. Therefore, it is possible to constitute at least one set of interdigitated electrode structure A arranged in the direction perpendicular to the first direction with the output pads 11. For example, as shown in FIG. 1, it is possible to constitute at least one set of interdigitated electrode structures A arranged in elevation direction with output pads 11. The at least one set of interdigitated electrode structure A is arranged at least in the first direction, namely the horizontal direction. Of course, in a case where the number of the outpu pads 11 is relatively large, it is also possible to set a plurality rows of interdigitated electrode structures A. FIG. 1 shows schematically two sets of interdigitated electrode structures A. It is to be noted, the above-mentioned interdigitated electrode structure A is a staggered structure including two sets of output pads crossing each other, which may furhter optimize the layout of output pads 11 and leads 12 connected therewith on the base material, and thereby may form more outpu pads 11 on the base material.

For example, in the chip on film provided in an example of the present embodiment, since there are many output pads 11, in order to optimize wiring of the chip on film, it is possible to connect output pads 11 to the chip by leads 12 arranged on different layers respectively. That is, lead 12 may include multiple sets of sub-leads arranged on different layers and high efficiency utilization and mutual insulating are realized by arranging each set of sub-leads on different layer. For example, sub-leads on different layers at least partially overlap in the direction perpendicular to the base material, thereby saving space.

Figure 2A:
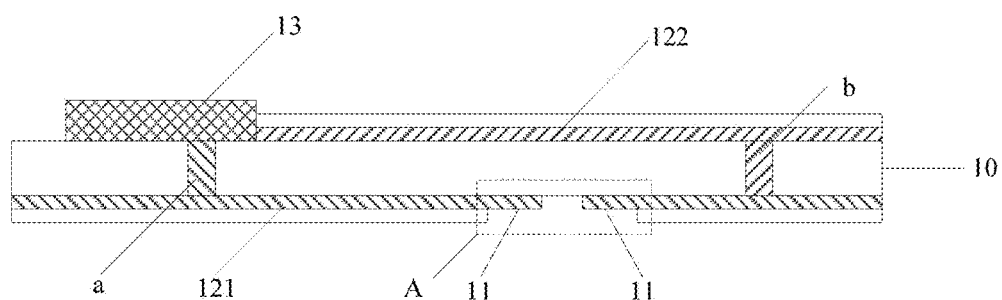
FIG. 2a is a side view of a chip on film provided in an embodiment of the present disclosure.
Figure 2B:
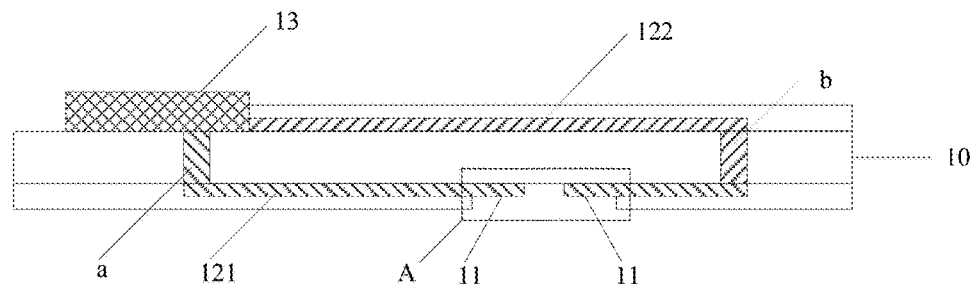
FIG. 2b is a cross-sectional schematic diagram of the chip on film provided in an embodiment of the present disclosure along the C-C' direction in FIG. 1.

For example, in the chip on film provided in an example of the present embodiment, as shown in FIGS. 2a and 2b, it is possible to arrange the chip 13 and output pads 11 on two sides of the base material 10 respectively. Here, leads 12 specifically include: first leads 121 arranged on the same side of the base material 10 as the output pads 11, and second leads 122 arranged on the same side of the base material 10 as the chip 13; in which one ends of the first leads 121 are connected with a part of the output pads 11 that constituting the interdigitated electrode structure A, and the another ends of the first leads 121 are connected to the chip 13 through first vias a penetrating the base material 10; one ends of the second leads 122 are connected with another part of output pads 11 that constituting the interdigitated electrode structures A through second vias b penetrating the base material 10, and the another ends of the another ends 122 are connected with the chip 13. It is to be noted that, the present embodiment includes, but not limited to the above-mentioned first leads and second leads, and leads 12 may further include more sub-leads arranged on different layers.

For example, in the chip on film provided in an example of the present embodiment, as shown in FIG. 1, output pads 11 connected with the first leads 121 and outpu pads 11 connected with the second leads 122 are distributed in the interdigitated electrode structures A alternatively.

For example, in the chip on film provided in an example of the present embodiment, as shown in FIG. 1, the second vias b that connect the second leads 122 and corresponding output pads 11 may be located in the region 15 where the interdigitated electrode structures A are located (shown in the figure by dashed lines). When such a chip on film is bonded onto the flexible display substrate, the second vias b will fall into the bonding region 15.

Figure 3:
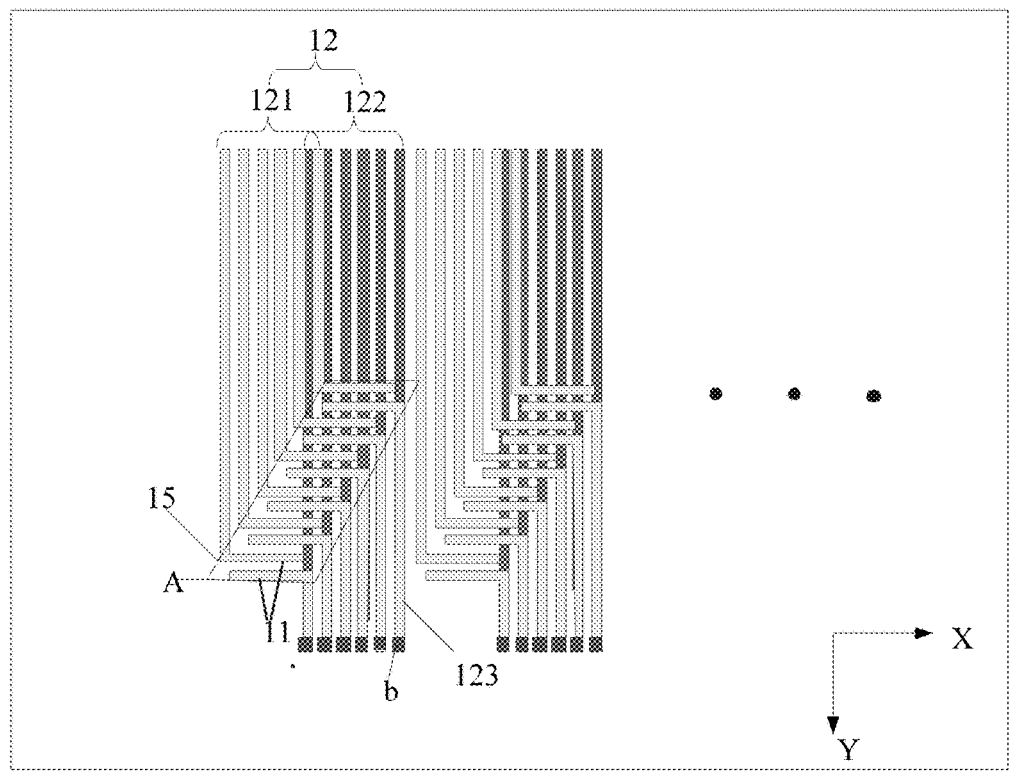
FIG. 3 is a structure diagram of a chip on film provided in another embodiment of the present disclosure.

For example, in the chip on film provided in an example of the present embodiment, as shown in FIG. 3, it is possible to locate the second vias b outside the region 15 where the interdigitated electrode structures A are located (shown by dashed lines in figure), such that when the chip on film is bonded to the flexible display substrate, the second vias b would fall outside the bonding region 15. Here, as shown in FIG. 3, the leads 12 may further include: the third leads 123 arranged on the same layer as the first leads 121 and in one-to-one correspondence with the second leads 122; in which an end of each of the third leads 123 is connected with an end of the corresponding second lead 122 through a second via b, and another end of each of the third leads 123 is connected with another part of output pads 11 that constitute the interdigitated electrode structures A.

Embodiment II

Figure 4A:
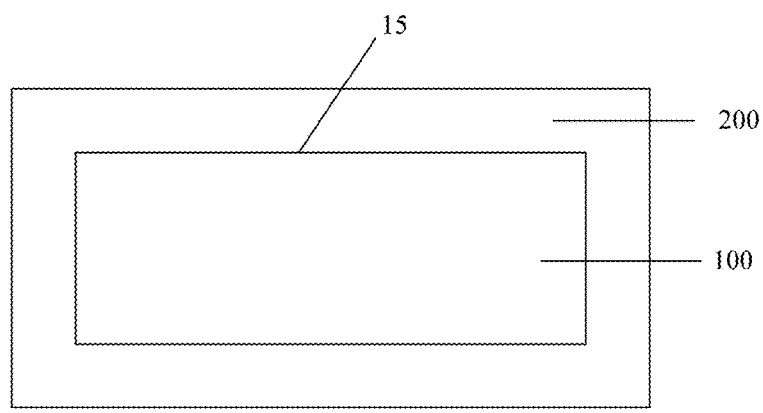
FIG. 4a is a schematic plan view of a display device provided in an embodiment of the present disclosure.
Figure 4B:
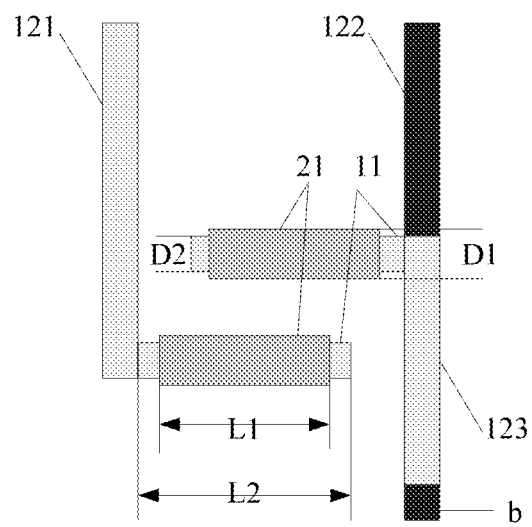
FIG. 4b is a partial structure diagram of a display device provided in an embodiment of the present disclosure.

The present embodiment provides a display device as shown in FIG. 4a, including a flexbile display panel 200 and a chip on film 100 provided in the above-mentioned embodiments bonded on the bonding region 15 of the flexible display panel 200. As shown in FIG. 4b, the flexible display panel has a plurality of input pads 21 in one-to-one correspondence with the output pads 11 of the chip on film extending in the first direction in the bonding region, and the output pads 11 in one-to-one correspondence with the output pads 21 are electrically connected by pressure welding. It is to be noted, the output pads 11 and input pads 21 in one-to-one correspondence with each other in the present embodiment may also be electrically connected in other ways, which is not limited herein. It is to be noted, the above-mentioned first direction generally may be the horizontal direction.

For example, in the display device provided in an example of the present embodiment, the display device may be any product or component with display function such as a mobile telephone, a tablet computer, a TV set, a display, a notebook computer, a digital photo frame or a navigator. The embodiments of the above-mentioned chip on film may be referred to for the implementation of the display device and repetitions will not be described any more.

For example, in the display device provided in an example of the present embodiment, in order that output pads 21 and input pads 11 always have the same coincidence area to guarantee the homogeneity of bonding effect when adjusting the relative position of the flexible display panel and the chip on film in the first direction, as shown in FIG. 4b, the corresponding output pad 21 has a length L1 in the first direction smaller than the length L2 of the output pad 11 in the first direction. It is to be noted, the above-mentioned first direction generally may be the horizontal direction.

For example, in the display device provided in an example of the present embodiment, in order that output pads 21 and input pads 11 always have the same coincidence area to guarantee the homogeneity of bonding effect when adjusting the relative position of the flexible display panel and the chip on film in the direction perpendicular to the first direction, as shown in FIG. 4b, the corresponding output pad 21 has a width D1 in the direction perpendicular to the first direction greater than the width D2 of the output pad 11 in the direction perpendicular to the first direction. It is to be noted, The above-mentioned direction perpendicular to the first direction generally may be the elevation direction.

With the above-mentioned chip on film and display device provided in at least one embodiment of the present disclosure, the chip on film has a plurality of output pads independent from each other extending in the first direction and disposed on a side of the base material. Correspondingly, the flexible display panel in the display device has a plurality of input pads in one-to-one correspondence with the output pads of the chip on film extending in the first direction in the bonding region, and the output pads in one-to-one correspondence with the output pads are electrically connected by pressure welding. By changing input pads and output pads in one-to-one correspondence from extending in elevation direction to along the first direction, the input pads and output pads occupy large span in the first direction. When the size of the flexible display panel varies in the first direction, it is possible to guarantee that the output pads of the chip on film and the input pads of the flexible display panel align correctly, thereby improving the bonding yield and reliability of the display device. Furthermore, although the input pads and output pads occupy reduced span in the elevation direction after extending in the direction perpendicular to the first direction, since the substrate size in direction perpendicular to the first direction of the flexible display panel will not change, it will not influence the alignment in elevation direction.

What are described above is related to the illustrative embodiments of the disclosure only and not limitative to the scope of the disclosure; the scopes of the disclosure are defined by the accompanying claims.

The present application claims priority of China Patent application No. 201610079781.7 filed on Feb. 4, 2016, the content of which is incorporated in its entirety as part of the present application by reference herein.

What is claimed is:

1. A chip on film comprising:
a base material;
a plurality of mutually independent output pads extending in a first direction and disposed on a side of the base material;
a chip; and
a plurality of leads, in one-to-one correspondence with the output pads and extending in a second direction, wherein the leads are configured to connect corresponding output pads to the chip, the second direction is parallel to a plane where the output pads are located, the output pads constitute at least one set of interdigitated electrode structures arranged in a direction perpendicular to the first direction,
the chip and the output pads are located on two sides of the base material, respectively, the leads comprise:
first leads disposed on the base material on a same side as the output pads, and
second leads disposed on the base material on a same side as the chip,
wherein, first ends of the first leads are connected with a part of output pads that constitute the interdigitated electrode structures, and second ends of the first leads are connected with the chip through first vias penetrating the base material,
first ends of the second leads are connected with another part of the output pads that constitute the interdigitated electrode structures through second vias penetrating the base material, and second ends of the second leads is connected with the chip.

2. The chip on film according to claim 1, wherein the second direction is perpendicular to the first direction.

3. The chip on film according to claim 1, wherein the output pads constitute at least one set of staggered structures which are parallel to each other in a direction perpendicular to the first direction and staggered in sequence in the first direction by a certain distance.

4. The chip on film according to claim 1, wherein the at least one set of the interdigitated electrode structures is arranged in the first direction.

5. The chip on film according to claim 1 wherein the leads comprise a plurality sets of sub-leads disposed on different layers.

6. The chip on film according to claim 5, wherein the sub-leads located on different layers overlap at least partially in a direction perpendicular to the base material.

7. The chip on film according to claim 1, wherein the output pads connected with the first leads and the output pads connected with the second leads are distributed among the interdigitated electrode structures alternatively.

8. The chip on film according to claim 1, wherein the second vias are located in a region where the interdigitated electrode structures are located.

9. The chip on film according to claim 1, wherein the second vias are located outside the region where the interdigitated electrode structures are located, and the leads further comprise: third leads disposed on a same layer as the first leads and in one-to-one correspondence with the second leads,
one end of each of the third leads is connected with one end of a corresponding one of the second leads through the second via, and another end of each of the third leads is connected with another partial output pads that constitute the interdigitated electrode structures.

10. The chip on film according to claim 1, wherein the output pads are parallel to each other in a direction perpendicular to the first direction.

11. A display device, comprising:
a flexible display panel, and
the chip on film according to claim 1 bonded on a bonding region of the flexible display panel,
wherein, the flexible display panel has a plurality of input pads in one-to-one correspondence with the output pads of the chip on film extending in the first direction in the bonding region, and the output pads and the output pads in one-to-one correspondence with each other are electrically connected by pressure welding.

12. The display device according to claim 11, wherein the input pads have a length in the first direction smaller than a length of the output pads in one-to-one correspondence with the input pads in the first direction.

13. The display device according to claim 11, wherein the input pads have a width in a direction perpendicular to the first direction greater than a width of the output pads in one-to-one correspondence with the input pads in a direction perpendicular to the first direction.

14. The chip on film according to claim 2, wherein the output pads constitute at least one set of staggered structures which are parallel to each other in a direction perpendicular to the first direction and staggered in sequence in the first direction by a certain distance.

15. The chip on film according to claim 2, wherein the output pads constitute at least one set of interdigitated electrode structures arranged in a direction perpendicular to the first direction.

16. The chip on film according to claim 2, wherein the leads comprise a plurality sets of sub-leads disposed on different layers.

* * * * *